(12) United States Patent
Musiol et al.

(10) Patent No.: US 6,525,600 B1
(45) Date of Patent: Feb. 25, 2003

(54) BANDPASS FILTER

(75) Inventors: Lothar Musiol, München (DE); Ralph Kuhn, Baldham (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/477,131

(22) Filed: Jan. 3, 2000

Related U.S. Application Data

(63) Continuation of application No. PCT/DE98/01846, filed on Jul. 3, 1998.

(30) Foreign Application Priority Data

Jul. 3, 1997 (DE) .......................................... 197 28 464

(51) Int. Cl.$^7$ ................................................ H03K 5/00
(52) U.S. Cl. ........................ 327/553; 327/552; 327/557; 333/174
(58) Field of Search ................................ 327/553, 335, 327/552, 558, 557; 330/107, 109, 305; 333/172, 173, 174

(56) References Cited

U.S. PATENT DOCUMENTS

| 4,207,590 | A | * | 6/1980 | Naimpally et al. | ........... 358/28 |
|---|---|---|---|---|---|
| 4,215,325 | A | * | 7/1980 | Sansone | ....................... 333/20 |
| 5,483,209 | A | | 1/1996 | Takayama | .................... 333/174 |
| 5,528,204 | A | * | 6/1996 | Hoang et al. | ................ 333/134 |
| 5,625,894 | A | * | 4/1997 | Jou | ............................. 455/78 |
| 5,697,087 | A | * | 12/1997 | Miya et al. | ................. 455/307 |

FOREIGN PATENT DOCUMENTS

| DE | 28 25 812 | 8/1979 |
|---|---|---|
| FR | 952 403 | 11/1949 |

* cited by examiner

*Primary Examiner*—Dinh T. Le
(74) *Attorney, Agent, or Firm*—Laurence A. Greenberg; Werner H. Stemer; Ralph E. Locher

(57) ABSTRACT

The bandpass filter has a comparatively large pass bandwidth, with, at the same time, comparatively steep edges up to the stop band and low attenuation in the passband. The bandpass filter contains three parallel LC elements, one of which is connected between the bandpass filter input and the bandpass filter output. The other two parallel LC elements each have one of their connections coupled to a fixed reference-ground potential.

9 Claims, 2 Drawing Sheets

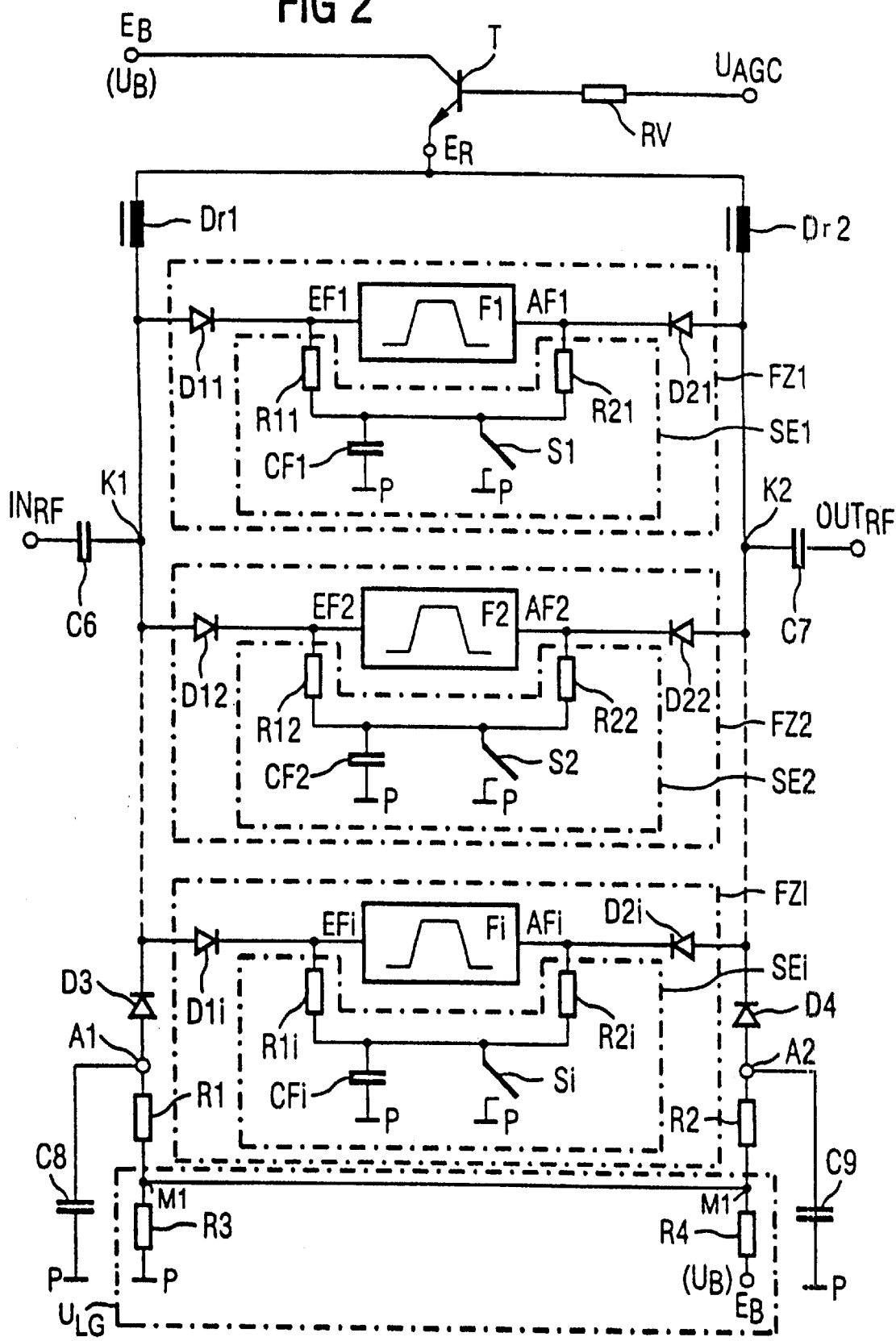

BANDPASS FILTER

CROSS-REFERENCE TO RELATED APPLICATION

This is a continuation of copending International Application PCT/DE98/01846, filed Jul. 3, 1998, which designated the United States.

BACKGROUND OF THE INVENTION

Field Of The Invention

The invention lies in the electronics field. More specifically, the invention relates to a bandpass filter, particularly for use in circuits using RF technology.

In many circuit configurations using RF technology, for example in circuit configurations for contiguous division of a relatively large frequency range (e.g. the TV frequency range) into a plurality of smaller frequency bands, bandpass filters are required which have a comparatively large pass bandwidth, with, at the same time, comparatively steep edges up to the stop band and low attenuation in the passband.

French patent document FR 952403 discloses a bandpass filter circuit. There, a capacitor is connected in series with a parallel LC element. The filter four-terminal circuit has an additional parallel LC element at the output.

U.S. Pat. No. 5,483,209 discloses a circuit for changing over between different reception bands with variable attenuation control. The circuit has a plurality of bandpass filters tuned to the different input reception frequencies. In addition, the circuit has a plurality of variable attenuation diodes whose impedances are controlled by means of an AGC. A plurality of switching diodes are used to select the bandpass filter tuned-to the input signal.

SUMMARY OF THE INVENTION

It is accordingly an object of the invention to provide a bandpass filter, which overcomes the above-mentioned disadvantages of the heretofore-known devices and methods of this general type and which satisfies the aforementioned requirements.

With the foregoing and other objects in view there is provided, in accordance with the invention, a bandpass filter, comprising:

a bandpass filter input and a bandpass filter output;

a series circuit connected between the bandpass filter input and the bandpass filter output, the series circuit being formed of a first capacitor, a first parallel LC element connected to the first capacitor, a second capacitor connected to the first parallel LC element, and an inductor connected to the second capacitor;

a second parallel LC element having a first connection connected to a node between the first parallel LC element and the second capacitor and a second connection coupled to a fixed reference-ground potential via a third capacitor; and a third parallel LC element having a first connection connected to a node between the second capacitor and the inductor and a second connection coupled to the fixed reference-ground potential, either directly or via a fourth capacitor connected between the second connection of the third parallel LC element and the fixed reference-ground potential.

In accordance with an additional feature of the invention, a fifth capacitor is connected to a node between the second capacitor and the inductor and to the fixed reference-ground potential.

With the above and other objects in view there is also provided, in accordance with the invention, a circuit configuration, comprising:

an AC voltage input terminal and an AC voltage output terminal;

a plurality of frequency domain filter paths defined between the AC voltage input terminal and the AC voltage output terminal, and connected in parallel between a common first node and a common second node both coupled to a DC voltage connection;

each of the frequency domain filter paths containing at least one of the above-outlined bandpass filters connected in series with a first diode and a second diode connected in opposite forward direction from the first diode;

each of the frequency domain filter paths containing a switching unit for switching the first and the second diode in the frequency domain filter path during an operation of the circuit configuration for turning a respective one of the bandpass filters;

a third diode having a first terminal connected to the first node and a fourth diode having a first terminal connected to the second node of the frequency domain filter paths, such that a respective cathode of the third diode and of the fourth diode is connected to anodes of the first diodes and the second diodes, respectively;

a load-dependent DC voltage source having a first connection and a second connection; and the third diode and the fourth diode each having a second terminal respectively connected to the first connection and the second connection of the load-dependent DC voltage source.

In accordance with another feature of the invention, the first, second, third, and fourth diodes are PIN diodes.

In accordance with a further feature of the invention, each of the switching units includes:

a first electrical resistor and a second electrical resistor respectively connected, via a first terminal thereof, to the input and to the output of an associated one of the frequency domain filters, and to one another via a second terminal thereof;

an on/off switch having a first terminal connected between the first electrical resistor and the second electrical resistor, and a second terminal connected to a fixed reference-ground potential; and a capacitor having a first terminal connected between the first electrical resistor and the second electrical resistor, and a second terminal connected to the fixed reference-ground potential.

In further summary, in the bandpass filter according to the invention:

a) a series circuit, comprising a first capacitor, a first parallel LC element, a second capacitor and an inductor, is connected between a bandpass filter input and a bandpass filter output, the individual elements in the series circuit being connected one after the other in the aforementioned sequence;

b) a second parallel LC element, whose second connection is coupled to a fixed reference-ground potential via a third capacitor, is connected in a connection line between the first parallel LC element and the second capacitor; and c) a third parallel LC element, whose second.connection is coupled to the fixed reference-ground potential directly or via a fourth capacitor, is connected in a connection line between the second capacitor and the inductor.

Optionally, the connection line between the second capacitor and the inductor is coupled to the fixed reference-ground potential (e.g. ground) via a fifth capacitor.

Other features which are considered as characteristic for the invention are set forth in the appended claims.

Although the invention is illustrated and described herein as embodied in a bandpass filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic diagram of a circuit configuration with bandpass filters in accordance with the examplary embodiment.

DESCRIPTION OF THE PREFERRED EMBODIMENTS

Figure 1:
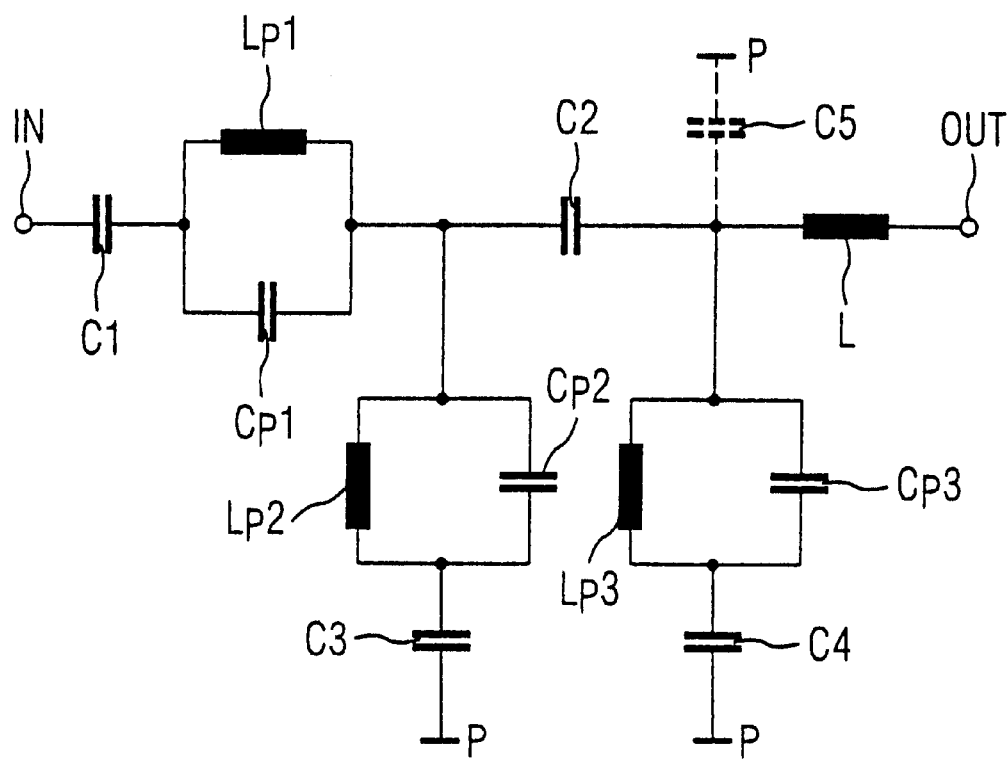
FIG. 1 is a circuit schematic of an exemplary embodiment of the filter according to the invention.

Referring now to the figures of the drawing in detail and first, particularly, to FIG. 1 thereof, there is seen a bandpass filter with a series circuit formed with a first capacitor Cl, a first parallel LC element $L_p1/C_p1$, a second capacitor C2, and an inductor L. The series circuit is connected between a bandpass filter input IN and a bandpass filter output OUT. The circuit elements are connected in series, one after the other, in the aforementioned sequence. A first connection of a second parallel LC element $L_p2/C_p2$, whose second connection is coupled to a fixed reference-ground potential P via a third capacitor C3, is connected between the first parallel LC element $L_p1/C_p1$ and the second capacitor C2. A first connection of a third parallel LC element $L_p3/C_p3$, whose second connection is coupled to the fixed reference-ground potential P directly or via a fourth capacitor C4, is connected between the second capacitor C2 and the inductor L.

An optional fifth capacitor C5 is illustrated in dashes. The capacitor C5 may be provided to connect the fixed reference-ground potential P to the node between the second capacitor C2 and the inductor L.

Optionally, a series circuit for the fixed reference-ground potential P can also be connected between the second capacitor C2 and the inductor L.

While the drawings illustrate, and the above description refers to, inductors L, $L_p1$, $L_p2$, $L_p3$, it is equally possible to use striplines as the inductances.

Reference will now be had to the circuit configuration shown in FIG. 2, where a parallel circuit, comprising a plurality of frequency domain filter paths FZ1, FZ2, . . . , FZi, is connected between an AC voltage input terminal $IN_{RF}$ and an AC voltage output terminal $OUT_{RF}$. Each of the frequency domain filter paths has a bandpass filter F1, F2, . . . , Fi in accordance with the exemplary embodiment shown in FIG. 1.

A sixth capacitor C6 is connected between the AC voltage input terminal $IN_{RF}$ and a first node K1 of the parallel circuit, and a seventh capacitor C7 is connected between a second node K2 of the parallel circuit and the AC voltage output terminal $OUT_{RF}$. These two capacitors C6 and C7 are essentially used for DC voltage decoupling of the AC voltage connections $IN_{RF}$ and $OUT_{RF}$.

The nodes K1 and K2 each have a regulating voltage connection $E_R$ coupled to them via the two inductor elements Dr1, Dr2, which is used to supply the nodes K1 and K2 with a direct current during operation. Instead of the inductor elements Dr1 and Dr2, suitable nonreactive resistors can also be used.

In the exemplary embodiment, the regulating voltage connection $E_R$ is connected to the emitter of a pnp transistor T whose collector is connected to the operating voltage input $E_B$ and whose base is connected to a control voltage connection $U_{AGC}$ via an electrical resistor RV.

Each frequency domain filter path FZ1, FZ2, . . . , FZi comprises a bandpass filter F1, F2, . . . , Fi connected between two diodes D11, D21; D12, D22; . . . ; D1i, D2i, preferably PIN diodes, in series with the latter. The two PIN diodes are connected with oppositely oriented forward directions.

Each bandpass filter F1, F2, . . . , Fi has a DC supply, comprising a first resistor R11, R12, . . . , R1i and a second resistor R21, R22, . . . , R2i, connected to it between the two associated diodes D11, D21; D12, D22; . . . ; D1i, D2i. The first resistor R11, R12, . . . , R1i and the second resistor R21, R22, . . . , R2i are respectively connected, on the one hand, to the input EF1, EF2, . . . , EFi and to the output AF1, AF2, . . . , AFi of the associated bandpass filter F1, F2, . . . , Fi and, on the other hand, to one another. FIG. 2 indicates switching units SE1, SE2, . . . , SEi in dash-dotted boxes which each have a first electrical resistor R11, R12, . . . , R1i and a second electrical resistor R21, R22, . . . , R2i which are respectively connected between the input and the output of the associated frequency domain filter F1, F2, . . . , Fi and to one another. The respective connection line between the two resistors R11, R21; R12, R22; . . . ; R1i, R2i is blocked off to alternating current by means of a capacitor CF1, CF2, . . . , CFi in each case and is connected to a first switch terminal of an "on/off" switch S1, S2, . . . , Si (preferably an electronic switch, e.g. an open-collector switching output of an integrated circuit) in each case, whose second switch connection is connected to a fixed reference-ground potential.

Connected in parallel with the frequency domain filter paths FZ1, FZ2, . . . , FZi is a series circuit comprising a third diode D3, a first resistor R1, a second resistor R2 and a fourth diode D4. The two diodes D3 and D4 are connected with oppositely oriented forward directions and are preferably likewise PIN diodes. In addition, the two resistors R1 and R2 are connected, on the one hand, to the diodes D3 and D4, respectively, and, on the other hand, to a center tap M1 of a voltage divider comprising a third resistor R3 and a fourth resistor R4.

The voltage divider is, on the one hand, connected to an operating voltage connection $E_B$, which is connected to the same voltage source as the regulating voltage connection $E_R$, for example, and, on the other hand, to the fixed reference-ground potential P. The first resistor R1 and the second resistor R2 and the voltage divider which includes the third resistor R3 and the fourth resistor R4 define a load-dependent DC-voltage source. The end of the first resistor R1 that is connected to the third diode D3 defines a first connection of the load-dependent DC voltage source and the end of the second resistor R2 that is connected to the fourth diode D4 defines a second connection of the load-dependent DC voltage source.

An eighth capacitor C8 and a ninth capacitor C9, whose second connections are connected to the fixed reference-ground potential P, are connected between the third diode D3 and the first resistor R1 and between the fourth diode D4 and the second resistor R2, respectively. These capacitors C8, C9 serve to derive the AC voltage for the fixed reference-ground potential P (e.g. ground).

Changing over between the individual frequency domain filter paths FZ1, FZ2, . . . , FZi is performed by means of the diode pairs D11, D21; D12, D22; . . . ; D1i, D2i, which are selectively switched on by the switches S1, S2, . . . , Si.

Advantageously, the respectively active diode pair D11, D21; D12, D22; . . . ; D1i, D2i is in this case simultaneously used as a series element of a regulatable Π-attenuation element whose parallel elements are the third and the fourth diode D3, D4. In the high state, the latter have zero current (high resistance). If the regulating voltage $U_R$ is reduced, current flows through them and they become less resistive, whereas the current through the respective active diode pair D11, D21; D12, D22; . . . ; D1i, D2i in the frequency domain filter path FZ1, FZ2, . . . , FZi which is operating falls with the regulating voltage, which means that these diodes become more resistive.

We claim:

1. A circuit configuration, comprising:

an AC voltage input terminal and an AC voltage output terminal;

a plurality of frequency domain filter paths defined between said AC voltage input terminal and said AC voltage output terminal, and connected in parallel between a common first node and a common second node both coupled to a DC voltage connection;

each of said frequency domain filter paths containing at least one bandpass filter connected in series with a first diode and a second diode connected in opposite forward direction from said first diode;

said at least one bandpass filter including:
    a bandpass filter input and a bandpass filter output;
    a series circuit connected between said bandpass filter input and said bandpass filter output, said series circuit being formed of a first capacitor, a first parallel LC element connected to said first capacitor, a second capacitor connected to said first parallel LC element, and an inductor connected to said second capacitor;
    a second parallel LC element having a first connection connected to a node between said first parallel LC element and said second capacitor and a second connection coupled to a fixed reference-ground potential via a third capacitor; and
    a third parallel LC element having a first connection connected to a node between said second capacitor and said inductor and a second connection coupled to the fixed reference-ground potential;

each of said frequency domain filter paths containing a switching unit for switching said first and said second diode in said frequency domain filter path;

a third diode having a first terminal connected to said first node and a fourth diode having a first terminal connected to said second node of said frequency domain filter paths, such that a respective cathode of said third diode and of said fourth diode is connected to anodes of said first diodes and said second diodes, respectively;

a load-dependent DC voltage source having a first connection and a second connection; and said third diode and said fourth diode each having a second terminal respectively connected to said first connection and said second connection of said load-dependent DC voltage source.

2. The circuit configuration according to claim 1, wherein said second connection of said third parallel LC element is directly connected to the fixed reference-ground potential.

3. The circuit configuration according to claim 1, which comprises a fourth capacitor connected between said second connection of said third parallel LC element and the fixed reference-ground potential.

4. The circuit configuration according to claim 1, wherein said bandpass filter has a further capacitor having a first terminal connected to a node between said second capacitor and said inductor and a second terminal connected to the fixed reference-ground potential.

5. The circuit configuration according to claim 1, wherein said first diode, said second diode, said third diode, and said fourth diode are PIN diodes.

6. The circuit configuration according to claim 1, wherein each of said switching units includes:

a first electrical resistor and a second electrical resistor respectively connected, via a first terminal thereof, to said input and to said output of an associated one of said frequency domain filters, and to one another via a second terminal thereof;

an on/off switch having a first terminal connected between said first electrical resistor and said second electrical resistor, and a second terminal connected to a fixed reference-ground potential; and a capacitor having a first terminal connected between said first electrical resistor and said second electrical resistor, and a second terminal connected to the fixed reference-ground potential.

7. A circuit configuration, comprising:

an AC voltage input terminal and an AC voltage output terminal;

a plurality of frequency domain filter paths defined between said AC voltage input terminal and said AC voltage output terminal, and connected in parallel between a common first node and a common second node both coupled to a DC voltage connection;

each of said frequency domain filter paths containing at least one bandpass filter connected in series with a first diode and a second diode connected in opposite forward direction from said first diode;

each of said frequency domain filter paths containing a switching unit for switching said first and said second diode in said frequency domain filter path;

a third diode having a first terminal connected to said first node and a fourth diode having a first terminal connected to said second node of said frequency domain filter paths for connecting a respective cathode of said third diode and of said fourth diode to anodes of said first diodes and said second diodes, respectively;

a load-dependent DC voltage source having a first connection and a second connection; and said third diode and said fourth diode each having a second terminal respectively connected to said first connection and said second connection of said load-dependent DC voltage source.

8. The circuit configuration according to claim 7, wherein said first diode, said second diode, said third diode, and said fourth diode are PIN diodes.

9. The circuit configuration according to claim 7, wherein each of said switching units includes:

a first electrical resistor and a second electrical resistor respectively connected, via a first terminal thereof, to said input and to said output of an associated one of said frequency domain filters, and to one another via a second terminal thereof;

an on/off switch having a first terminal connected between said first electrical resistor and said second electrical resistor, and a second terminal connected to a fixed reference-ground potential; and a capacitor having a first terminal connected between said first electrical resistor and said second electrical resistor, and a second terminal connected to the fixed reference-ground potential.

* * * * *